United States Patent
Suzuki et al.

(10) Patent No.: US 8,247,030 B2
(45) Date of Patent: Aug. 21, 2012

(54) VOID-FREE COPPER FILLING OF RECESSED FEATURES USING A SMOOTH NON-AGGLOMERATED COPPER SEED LAYER

(75) Inventors: Kenji Suzuki, Guilderland, NY (US); Atsushi Gomi, Kai (JP); Miho Jomen, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 614 days.

(21) Appl. No.: 12/044,191

(22) Filed: Mar. 7, 2008

(65) Prior Publication Data

US 2009/0226611 A1    Sep. 10, 2009

(51) Int. Cl.
C23C 16/00    (2006.01)

(52) U.S. Cl. .................... 427/250; 427/248.1

(58) Field of Classification Search .................. 427/250, 427/248.1; 438/687, 681
See application file for complete search history.

(56) References Cited

U.S. PATENT DOCUMENTS

| | | | |
|---|---|---|---|
| 4,851,895 A | 7/1989 | Green et al. |
| 4,929,468 A | 5/1990 | Mullendore |
| 4,938,999 A | 7/1990 | Jenkin |
| 5,171,610 A | 12/1992 | Liu |
| 5,372,849 A | 12/1994 | McCormick et al. |
| 5,877,086 A | 3/1999 | Aruga |
| 6,063,705 A | 5/2000 | Vaartstra |
| 6,074,945 A | 6/2000 | Vaartstra et al. |
| 6,077,780 A | 6/2000 | Dubin |
| 6,232,230 B1 | 5/2001 | Iacoponi |
| 6,242,349 B1 | 6/2001 | Nogami |
| 6,287,435 B1 | 9/2001 | Drewery et al. |
| 6,303,809 B1 | 10/2001 | Chi et al. |
| 6,319,832 B1 | 11/2001 | Uhlenbrock et al. |
| 6,399,486 B1 | 6/2002 | Chen et al. |
| 6,420,583 B1 | 7/2002 | Lienhard et al. |
| 6,440,495 B1 | 8/2002 | Wade et al. |
| 6,440,854 B1 | 8/2002 | Rozbicki |
| 6,444,263 B1 | 9/2002 | Paranjpe et al. |
| 6,508,919 B1 | 1/2003 | Licata et al. |
| 6,605,735 B2 | 8/2003 | Kawano et al. |
| 6,627,542 B1 | 9/2003 | Gandikota et al. |
| 6,713,373 B1 | 3/2004 | Omstead |
| 6,989,321 B2 | 1/2006 | Yamasaki et al. |

(Continued)

FOREIGN PATENT DOCUMENTS

CA    2206217 A1    11/1998

(Continued)

OTHER PUBLICATIONS

Czekaj, C., et al. Inorganic Chemistry, 1988, 27, p. 8-10.

(Continued)

*Primary Examiner* — Kelly M Gambetta

(57) ABSTRACT

A method is provided for controlling copper agglomeration on a substrate and for forming void-free bulk copper metal filling of recessed features in integrated circuits. In one embodiment, the method includes providing a substrate having a topography including a top surface and at least one recessed feature comprising at least a sidewall surface and a bottom surface, depositing a barrier film on the substrate topography, and depositing a metal-containing wetting film on the barrier film. The method further includes physical vapor depositing copper metal on the metal-containing wetting film, where the substrate temperature is sufficiently high to form a smooth copper metal seed layer on the metal-containing wetting film. Void-free bulk copper metal may be plated in the at least one recessed feature.

19 Claims, 10 Drawing Sheets

U.S. PATENT DOCUMENTS

| | | | |
|---|---|---|---|
| 7,037,836 B2 | 5/2006 | Lee | |
| 7,107,998 B2 | 9/2006 | Greer et al. | |
| 7,115,498 B1 | 10/2006 | Adem | |
| 7,264,846 B2 | 9/2007 | Chang et al. | |
| 7,270,848 B2 | 9/2007 | Suzuki et al. | |
| 7,279,421 B2 | 10/2007 | Suzuki | |
| 7,285,308 B2 | 10/2007 | Hendrix et al. | |
| 7,288,479 B2 | 10/2007 | Suzuki | |
| 7,459,396 B2 | 12/2008 | Suzuki et al. | |
| 7,694,413 B2 | 4/2010 | Johnston et al. | |
| 7,704,879 B2 | 4/2010 | Suzuki | |
| 2003/0129306 A1 | 7/2003 | Wade et al. | |
| 2004/0241321 A1 | 12/2004 | Ganguli et al. | |
| 2005/0110142 A1 | 5/2005 | Lane et al. | |
| 2006/0113675 A1 | 6/2006 | Chang et al. | |
| 2006/0121733 A1* | 6/2006 | Kilpela et al. | 438/681 |
| 2006/0131751 A1 | 6/2006 | Minamihaba et al. | |
| 2006/0199372 A1 | 9/2006 | Chung | |
| 2006/0220248 A1 | 10/2006 | Suzuki | |
| 2006/0223310 A1* | 10/2006 | Suzuki | 438/652 |
| 2006/0237800 A1 | 10/2006 | Rudeck | |
| 2006/0240187 A1 | 10/2006 | Weidman | |
| 2006/0258152 A1 | 11/2006 | Haider | |
| 2006/0273431 A1 | 12/2006 | He et al. | |
| 2007/0059502 A1* | 3/2007 | Wang et al. | 428/209 |
| 2007/0072415 A1 | 3/2007 | Suzuki | |
| 2007/0099422 A1* | 5/2007 | Wijekoon et al. | 438/687 |
| 2007/0141735 A1 | 6/2007 | Joo et al. | |
| 2007/0281457 A1 | 12/2007 | Chu et al. | |
| 2007/0284736 A1 | 12/2007 | Yang et al. | |
| 2008/0081464 A1 | 4/2008 | Matsuda et al. | |
| 2008/0190760 A1* | 8/2008 | Tang et al. | 204/192.17 |
| 2008/0237029 A1 | 10/2008 | Tang et al. | |
| 2008/0264774 A1 | 10/2008 | Bhaskaran et al. | |
| 2008/0284020 A1 | 11/2008 | Ishizaka | |
| 2009/0085211 A1 | 4/2009 | Robison et al. | |

FOREIGN PATENT DOCUMENTS

| | | |
|---|---|---|
| EP | 0620291 A1 | 10/1994 |
| JP | 200414516 A | 5/2004 |
| WO | 0012777 A1 | 3/2000 |
| WO | WO0026432 A1 | 5/2000 |
| WO | WO2005034223 A1 | 4/2005 |
| WO | WO2006046386 A1 | 5/2006 |

OTHER PUBLICATIONS

Wang et al., Low-temperature chemical vapor deposition and scaling limit of ultrathin Ru films, Applied Physics Letters, Feb. 23, 2004, p. 1380-1382, vol. 84, No. 8, American Institute of Physics, Melville, NY.

Boyd, Edwin P. et al., Chemical vapor deposition of metallic thin films using homonuclear and heteronuclear metal carbonyls, Chem. Mater. (1997) No. 9, pp. 1154-1158.

Green, M.L. et al., Chemical vapor deposition of ruthenium and ruthenium dioxide films, Journal of the Electrochemical Society, vol. 132, No. 11, pp. 2677-2685.

Cheng, Wei-Yuan et al., Initial growth of chemical-vapor-deposited Ru from bis(hexafluoroacetylacetonate0 dicarbonyl ruthenium, Thin Solid Films 483 (2005) pp. 31-37.

Gatineau, Julien et al., Deposition of highly pure ruthenium thin films with a new metal-organic precursor, Surface and Coatings Technology 201 (2007), pp. 9146-9148.

Bykov, A.F. et al, Investigation of thermal properties of ruthenium (III) beta-diketonate precursors for preparation of $RuO_2$ films by CVD, Journal of Thermal Analysis, vol. 46 (1996) pp. 1551-1565.

European Patent Office, International Search Report and Written Opinion of Pot Application No. PCT/US2009/031414, dated Apr. 29, 2009, 14pp.

U.S Patent and Trademark Office, Non-final Office Action for U.S. Appl. No. 11/864,960 dated Jul. 24, 2009, 30pp.

U.S. Patent and Trademark Office, Final Office Action received for U.S. Appl. No. 11/693,298 dated Dec. 22, 2009, 21 pp.

European Patent Office, International Search Report and Written Opinion of corresponding PCT Application No. PCT/IB2009/050910, dated Jul. 2, 2009, 15 pages.

U.S. Patent and Trademark Office, Non-final Office Action for related U.S. Appl. No. 11/693,298 dated Apr. 13, 2009, 12 pages.

Chen et al., "Novel Post Electroplating In-Situ Rapid Annealing Process for Advanced Copper Interconnect Applications," IEEE, 2000, pp. 194-196.

U.S. Patent and Trademark Office, Office communication for U.S. Appl. No. 11/864,566 dated Jul. 2, 2010, 6 pages.

\* cited by examiner

VOID-FREE COPPER FILLING OF RECESSED FEATURES USING A SMOOTH NON-AGGLOMERATED COPPER SEED LAYER

CROSS-REFERENCE TO RELATED APPLICATIONS

The present invention is related to U.S. patent application Ser. No. 11/693,298, filed Mar. 29, 2007 and entitled METHOD OF FORMING LOW-RESISTIVITY COPPER FILM STRUCTURES. The present invention is related to U.S. patent application Ser. No. 11/864,566, filed Sep. 28, 2007 and entitled VOID-FREE COPPER FILLING OF RECESSED FEATURES FOR SEMICONDUCTOR DEVICES. The entire content of these applications is incorporated herein by reference.

FIELD OF THE INVENTION

The invention relates to manufacturing of semiconductor devices, and more particularly to controlling copper agglomeration on a substrate and processing methods for void-free bulk copper metal (Cu) filling of recessed features in integrated circuits.

BACKGROUND OF THE INVENTION

An integrated circuit (IC) contains various semiconductor devices and a plurality of conducting metal paths that provide electrical power to the semiconductor devices and allow these semiconductor devices to share and exchange information. Within an integrated circuit, metal layers are stacked on top of one another using intermetal or interlayer dielectric layers that insulate the metal layers from each other. Normally, each metal layer must form an electrical contact to at least one additional metal layer. Such electrical contact is achieved by etching a hole (i.e., a via) in the interlayer dielectric that separates the metal layers, and filling the resulting via with a metal to create an interconnect structure. Metal layers typically occupy etched pathways in the interlayer dielectric. A "via" normally refers to any micro-feature such as a hole, line or other similar feature formed within a dielectric layer that provides an electrical connection through the dielectric layer to a conductive layer underlying the dielectric layer. Similarly, micro-features containing metal layers connecting two or more vias are normally referred to as trenches.

A long-recognized objective in the constant advancement of integrated circuit (IC) technology is the scaling down of IC dimensions. Such scale down of IC dimensions reduces area capacitance and is critical to obtaining higher speed performance of ICs. Moreover, reducing the area of an IC die leads to higher yield in IC fabrication. These advances are driving forces to constantly scale down IC dimensions. An increase in device performance is normally accompanied by a decrease in device area or an increase in device density. An increase in device density requires a decrease in via dimensions used to form interconnects, including a larger aspect ratio (i.e., depth to width ratio). As the minimum feature dimensions on patterned substrates (wafers) steadily decreases, several consequences of this downward scaling are becoming apparent. As the width of metal lines are scaled down to smaller submicron and even nanometer dimensions, the small features are difficult to fill with bulk metal, leading to formation of voids in the bulk metal filling and electromigration (EM) failure, which may lead to open and extruded metal lines.

The introduction of copper metal into multilayer metallization schemes for manufacturing integrated circuits is enabled by the damascene copper metal plating process where bulk copper metal is used to fill vias and/or trenches, and a chemical mechanical polishing (CMP) process is performed to planarize the bulk copper metal. The copper metal plating process is now extensively used by manufacturers of advanced microprocessors and application-specific circuits. However, copper metal cannot be put in direct contact with dielectric materials since copper metal has poor adhesion to the dielectric materials and copper metal is known to easily diffuse into common integrated circuit materials such as silicon and dielectric materials where copper is a mid-bandgap impurity. Furthermore, oxygen can diffuse from an oxygen-containing dielectric material into copper metal, thereby decreasing the electrical conductivity of the copper metal. Therefore, a diffusion barrier material is formed on dielectric materials and other materials in the integrated circuits to surround the copper metal and prevent diffusion of the copper metal into the integrated circuit materials. A tantalum nitride/tantalum (TaN/Ta) bilayer is commonly used as a diffusion barrier/adhesion layer for copper metallization since the tantalum nitride barrier film adheres well to oxides and provides a good barrier to copper diffusion and the tantalum adhesion layer provides good bonding to both tantalum nitride on which it is formed and to the copper metal formed over it. However, a tantalum adhesion layer is easily oxidized which reduces its copper wetting properties.

Copper metal plating on interconnect structures usually requires a nucleation or seed layer (e.g., a copper metal seed layer) that is deposited over a substrate topography prior to copper metal plating. However, it is well known that copper metal agglomeration occurs when a copper metal seed layer is deposited on tantalum and many other materials at room temperature. The copper metal agglomeration results in a discontinuous copper metal seed layer. The copper metal agglomeration is detrimental to the subsequent copper metal plating process and frequently results in formation of voids in the plated bulk copper metal. In order to reduce the copper metal agglomeration on a tantalum adhesion layer, the copper metal seed layer is often deposited at a low substrate temperature, for example −25° C., −30° C., or even lower substrate temperatures, using a low-temperature electrostatic chuck (ESC) to support and maintain the substrate (wafer) at the low substrate temperature. However, the low substrate temperatures result in rough or irregular copper metal layers and do not eliminate the copper metal agglomeration on the tantalum adhesion layer and the formation of voids in the plated bulk copper metal.

Therefore, processing methods are needed for forming smooth non-agglomerated copper metal seed layers that allow void-free copper metal filling of small recessed features with high aspect ratios.

SUMMARY OF THE INVENTION

A method is provided for controlling copper agglomeration on a substrate and for forming void-free bulk copper metal filling of recessed features in integrated circuits. The method utilizes a metal-containing wetting film that enables formation of a smooth copper metal seed layer and void-free copper metal filling of small recessed features with high-aspect-ratios.

According to one embodiment of the invention, a method is provided for controlling copper agglomeration on a substrate. The method includes providing a substrate having a topography including a top surface and at least one recessed feature comprising at least a sidewall surface and a bottom surface; depositing a barrier film on the substrate topography; depositing a metal-containing wetting film on the barrier film; and depositing copper metal on the metal-containing wetting film by physical vapor deposition, where the metal-containing wetting film prevents agglomeration of the copper metal and where the substrate temperature is sufficiently high to cause the copper metal to form a smooth copper metal seed layer on the metal-containing wetting film.

According to one embodiment of the invention, a method is provided for processing a substrate. The method includes providing a substrate having a topography including a top surface and at least one recessed feature containing at least a sidewall surface and a bottom surface; depositing a barrier film on the substrate topography; and depositing a metal-containing wetting film on the barrier film. The method further includes physical vapor depositing copper metal on the metal-containing wetting film, where the metal-containing wetting film prevents agglomeration of the copper metal and where the substrate temperature is greater than 0° C. and causes the copper metal to form a smooth copper metal seed layer on the metal-containing wetting film; and plating void-free bulk copper metal in the at least one recessed feature.

DETAILED DESCRIPTION OF SEVERAL EMBODIMENTS OF THE INVENTION

Figure 1A:
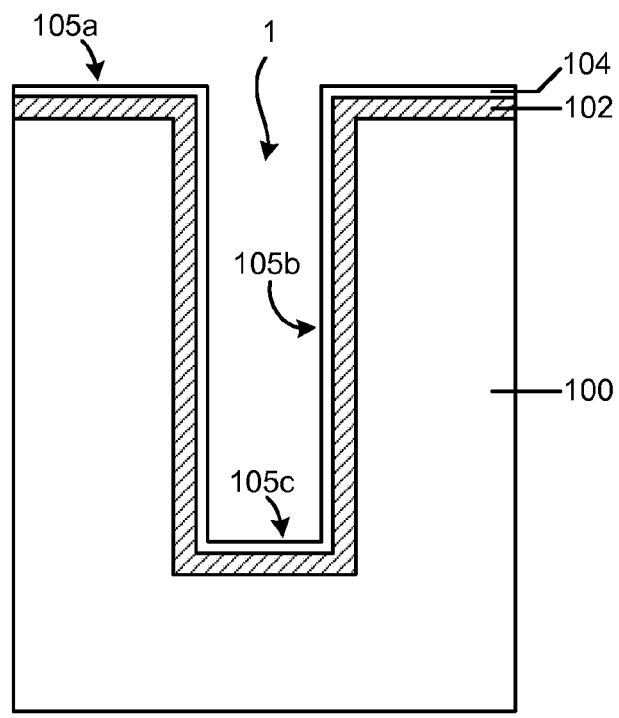
FIGS. 1A-1C schematically show cross-sectional views of a method for void-free filling of a recessed feature with bulk copper metal using a smooth copper metal seed layer according to an embodiment of the invention.

A method is provided for controlling copper agglomeration on a substrate and for providing void-free bulk copper metal filling of recessed features in integrated circuits. In one embodiment, deposition of a smooth copper metal seed layer by physical vapor deposition in a recessed feature is facilitated by an underlying metal-containing wetting film. The metal-containing wetting film can contain a metal film that provides a small contact angle with an overlaying copper metal film, thereby providing good wetting of copper metal on the metal-containing wetting film. The metal-containing wetting film can, for example, contain amorphous, polycrystalline, or crystalline ruthenium metal (Ru), palladium metal (Pd), rhodium metal (Rh), or silver metal (Ag), or a combination thereof. In other examples, the metal-containing wetting film can contain compounds of these metals and nitrogen, oxygen, carbon, boron, or phosphorus, for example. The processing methods presented in embodiments of the invention are suitable for void-free bulk copper metal filling of sub-micron recessed features in high volume manufacturing of semiconductor devices using large patterned substrates (wafers) such as 200 mm, 300 mm, or even larger diameter substrates.

One skilled in the relevant art will recognize that the various embodiments may be practiced without one or more of the specific details, or with other replacement and/or additional methods, materials, or components. In other instances, well-known structures or operations are not shown or described in detail to avoid obscuring aspects of various embodiments of the invention. Similarly, for purposes of explanation, specific numbers, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

When copper metal is deposited on a typical barrier film in IC metallization such as tantalum or tantalum nitride it tends to agglomerate. The behavior of copper metal on a barrier film is determined by the balance of surface forces at the interface of the copper metal and the barrier film. In the case of tantalum or tantalum nitride barrier films, even if the copper metal is deposited conformally, due to thermodynamics of the copper metal on the barrier film, it will agglomerate after deposition and form a non-continuous agglomerated copper metal seed layer with gaps in the copper metal seed layer exposing the barrier film. Copper, in its pure elemental form is extremely mobile at typical temperatures at which physical vapor deposition is carried out, and thus achieves the thermodynamically favored state very quickly. In order to reduce copper metal agglomeration on tantalum or tantalum nitride barrier films, copper metal seed layers are typically deposited at low or very low substrate temperatures, including temperatures below 0° C., for example −25° C., −30° C., −50° C., or even lower substrate temperatures. Although copper metal agglomeration is reduced at these low and very low substrate temperature, the copper metal seed layers do not provide a smooth copper metal coating of the barrier film.

Embodiments of the invention describe processing methods for controlling copper agglomeration on a substrate and for depositing smooth copper metal seed layers over recessed features and filling the recessed features with void-free bulk copper metal. In one embodiment, deposition of a smooth copper metal seed layer is enabled by an underlying metal-containing wetting film. The current inventors have realized that a smooth copper metal seed layer may be deposited by physical vapor deposition on a metal-containing wetting film at relatively high substrate temperatures. This is unexpected and distinctly different from prior art since, as described above, copper metal seed layers have typically been deposited at very low substrate temperatures, including temperatures below 0° C., for example −25° C., −30° C., −50° C., or even lower substrate temperatures, in order to reduce copper metal seed layer agglomeration that occurs at higher substrate temperatures.

Figure 6A:
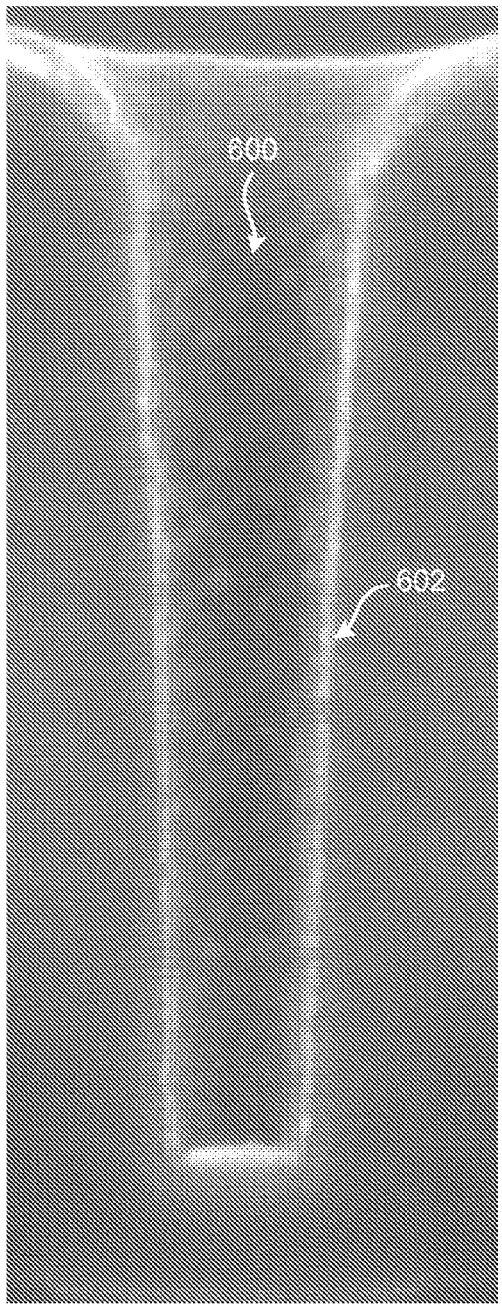
FIGS. 6A and 6B show cross-sectional scanning electron microscope (SEM) graphs of copper metal seed layers deposited by physical vapor deposition on ruthenium metal wetting films at different substrate temperatures.
Figure 6B:
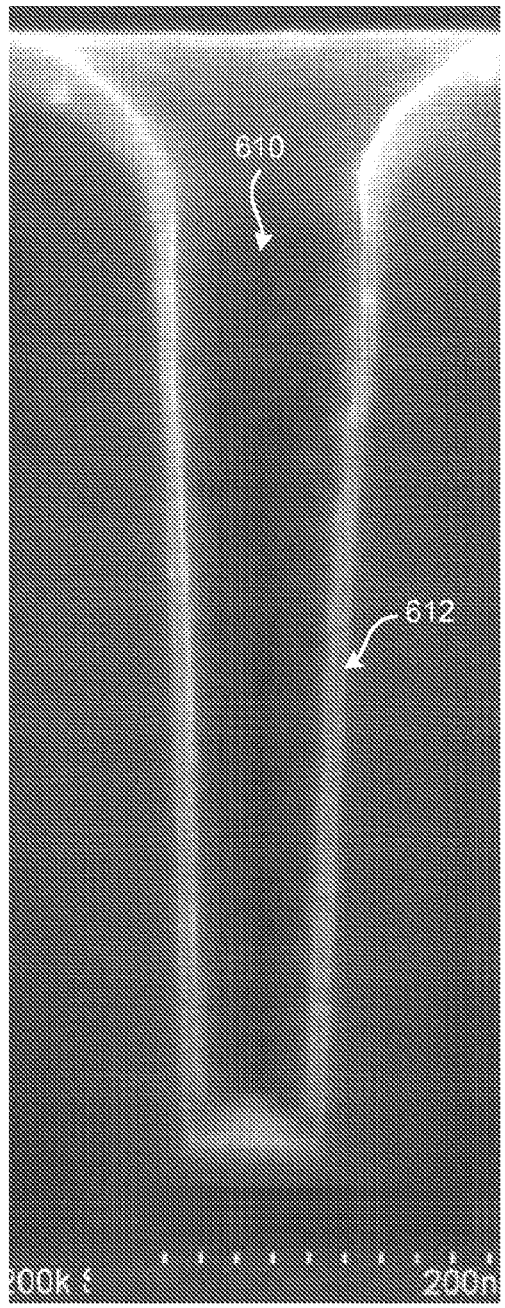

FIGS. 6A and 6B show cross-sectional scanning electron microscope (SEM) graphs of copper metal seed layers deposited by physical vapor deposition on ruthenium metal wetting films at different substrate temperatures. FIG. 6B shows that copper metal deposition on a ruthenium metal wetting film in a recessed feature 610 with a width of about 100 nm (nanometer) and an aspect ratio of ~4:1-5:1 at a substrate temperature of 30° C. formed a smooth copper metal seed layer. The combination of the copper metal seed layer and the ruthenium metal wetting film is indicated by arrow 612. The ruthenium metal wetting film is conformal with a thickness of about 2 nm and the copper metal seed layer has a thickness of about 1-2 nm in the feature 610 and a thickness of about 20 nm in the field area around the feature 610. Subsequent bulk copper metal filling (not shown) of the recessed feature 610 using a typical copper plating process achieved void-free filling of the recessed feature 610. It is contemplated that the smooth copper metal seed layer facilitated dense copper metal nucleation resulting in reduced voids in the bulk copper metal fill of the recessed feature 610.

For comparison, as shown in FIG. 6A, when copper metal was deposited on a ruthenium metal wetting film in a recessed feature 600 at a substrate temperature of −30° C. and subsequently warmed up to approximately room temperature for analysis, a non-continuous copper metal seed layer was observed on the ruthenium metal wetting film. The combination of the copper metal seed layer and the ruthenium metal wetting film is indicated by arrow 602. Subsequent bulk copper metal filling of the recessed feature 600 using a copper plating process led to voids in the bulk copper metal fill (not shown). It is well known to those skilled in the art that the presence of voids in the bulk copper metal fill increases the electrical resistance of the semiconductor device and has other detrimental effects, such as electromigration (EM) failure which may lead to open and extruded copper metal lines.

Although not wishing to be bound by theory, it is contemplated that higher substrate temperature (e.g., greater than 0° C., for example 30° C.) leads to higher mobility (migration) of copper metal on a ruthenium metal wetting film but, due to the good wetting properties of the ruthenium metal wetting film, a smooth copper metal seed layer is formed on the ruthenium metal wetting film. If the substrate temperature is too high, for example greater than 200° C., agglomeration of the copper metal seed layer may occur. For further comparison, a non-continuous rough copper metal seed layer was formed on a tantalum barrier film, both at substrate temperatures of −30° C. and 30° C. This illustrates that the combination of a ruthenium metal wetting film and high substrate temperature (e.g., greater than 0° C.) during copper metal physical vapor deposition enables formation of a smooth copper metal seed layer for subsequent void-free bulk copper filing of a typical recessed feature found in integrated circuits.

Figure 1B:
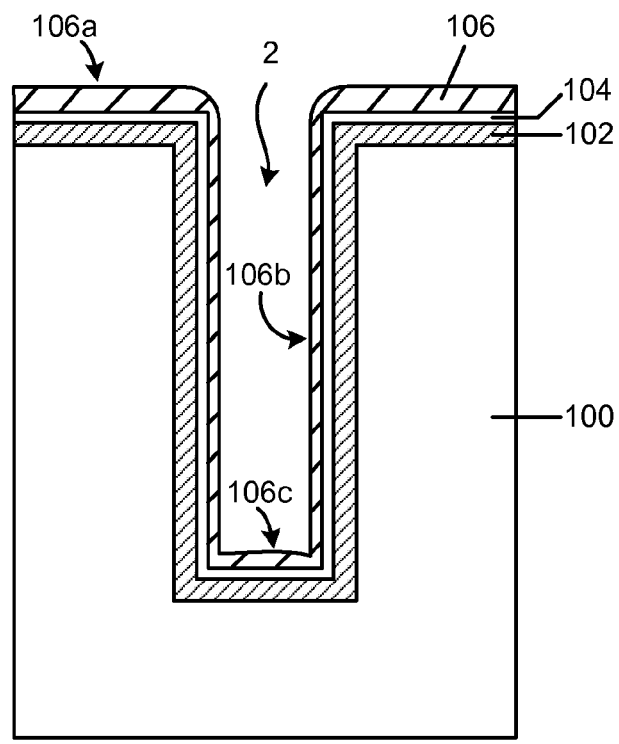
Figure 1C:
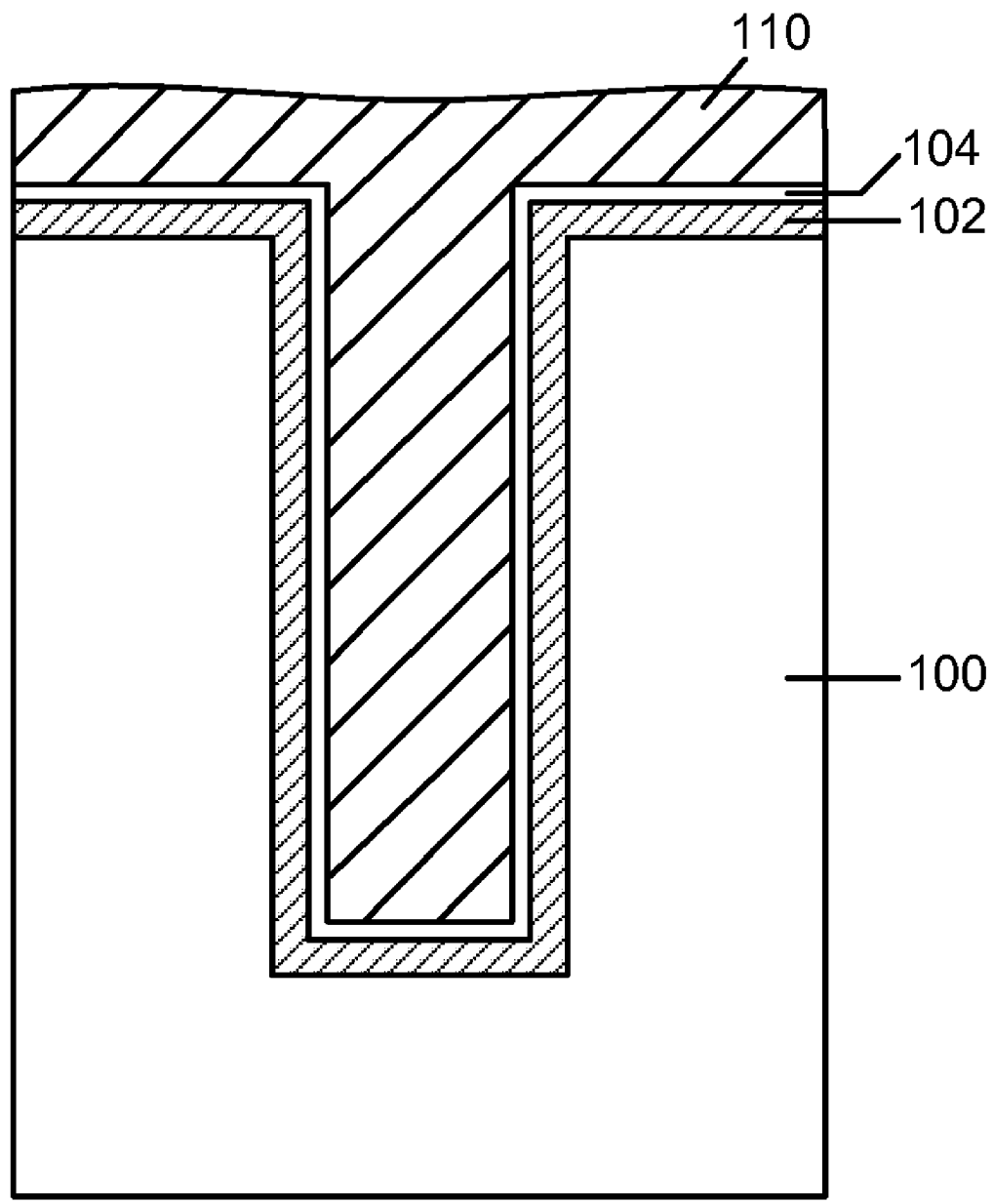

FIGS. 1A-1C schematically show cross-sectional views of a method for void-free filling of a recessed feature with bulk copper metal using a smooth copper metal seed layer according to an embodiment of the invention. FIG. 1A shows recessed feature 1 formed in a substrate 100, for example a Si substrate or a dielectric material. The dielectric material can, for example, contain $SiO_2$, a low-k dielectric material such as fluorinated silicon glass (FSG), carbon doped oxide, a polymer, a SiCOH-containing low-k material, a non-porous low-k material, a porous low-k material, a chemical vapor deposition low-k material, a spin-on dielectric (SOD) low-k material, or any other suitable dielectric material. The structure shown in FIG. 1A contains a "field" region 105a around the recessed feature 1, and sidewall region 105b and bottom region 105c in the recessed feature 1.

According to one embodiment of the invention, the recessed feature 1 can have an aspect ratio (depth/width) greater than or equal to about 2:1, for example 3:1, 4:1, 5:1, 6:1, 12:1, 15:1, or greater. The recessed feature can have a width of about 500 nm or less, for example 200 nm, 150 nm, 100 nm, 65 nm, 45 nm, 32 nm, 20 nm, or lower. However, embodiments of the invention are not limited to these aspect ratios or feature widths, as other aspect ratios or feature widths may be utilized. Further, embodiments of the invention may be applied to recessed features with other shapes. For example, these other recessed feature shapes can include "V" (convex) profiles or reentrant (concave) profiles.

FIG. 1A further shows a barrier film 102 formed over the recessed feature 1. The barrier film 102 can, for example, contain a metal nitride barrier film 102 or a metal silicon nitride barrier film 102. Examples of metal nitride barrier films include tantalum nitride (TaN), titanium nitride (TiN), or tungsten nitride (WN), or a combination thereof. The combination may include two or more separate TaN, TiN, and WN films, for example TaN/TiN or TaN/WN. Examples of metal silicon nitride barrier films can include tantalum silicon nitride (TaSiN), titanium silicon nitride (TiSiN), or tungsten silicon nitride (WSiN). A thickness of the barrier film 102 can, for example, be between about 1 nm and about 10 nm, or between about 2 nm and about 5 nm, for example about 4 nm. The barrier film 102 may be deposited by a variety of different deposition methods known by one of ordinary skill in the art, including, but not limited to, chemical vapor deposition (CVD), pulsed CVD, plasma-enhanced CVD (PECVD), atomic layer deposition (ALD), plasma-enhanced ALD (PEALD), or sputtering methods. According to one embodiment of the invention, the barrier film 102 may be deposited by a non-plasma process, e.g., CVD, pulsed CVD, or ALD, to avoid possible plasma damage during processing. Furthermore, non-plasma processes are usually better able to deposit continuous films than plasma processes, especially for patterned substrates containing high aspect ratio structures.

A wide variety of Ta-, Ti-, and W-containing precursors may be utilized for depositing the barrier film 102. Representative examples of Ta-containing precursors include $Ta(NMe_2)_5$ (pentakis(dimethylamido)tantalum, PDMAT), $Ta(NEtMe)_5$ (pentakis(ethylmethylamido)tantalum, PEMAT), ($^t$BuN)Ta(NMe$_2$)$_3$ (tert-butylimido tris(dimethylamido)tantalum, TBTDMT), ($^t$BuN)Ta(NEt$_2$)$_3$ (tert-butylimido tris(diethylamido)tantalum, TBTDET), ($^t$BuN)Ta(NEtMe)$_3$ (tert-butylimido tris(ethylmethylamido)tantalum, TBTEMT), (EtMe$_2$CN)Ta(NMe$_2$)$_3$ (tert-amylimido tris(dimethylamido)tantalum, TAIMATA), ($^i$PrN)Ta(NEt$_2$)$_3$ (iso-propylimido tris(diethylamido)tantalum, IPTDET), Ta$_2$(OEt)$_{10}$ (tantalum penta-ethoxide, TAETO), (Me$_2$NCH$_2$CH$_2$O)Ta (OEt)$_4$ (dimethylaminoethoxy tantalum tetra-ethoxide, TAT-DMAE), and TaCl$_5$ (tantalum pentachloride). Representative examples of Ti-containing precursors include Ti(NEt$_2$)$_4$ (tetrakis(diethylamido)titanium, TDEAT), Ti(NMeEt)$_4$ (tetrakis(ethylmethylamido)titanium, TEMAT), Ti(NMe$_2$)$_4$ (tetrakis(dimethylamido)titanium, TDMAT), Ti(THD)$_3$ (tris(2,2,6,6-tetramethyl-3,5-heptanedionato)titanium), and TiCl$_4$ (titanium tetrachloride). Representative examples of W-containing precursors include W(CO)$_6$ (tungsten hexacarbonyl), WF$_6$ (tungsten hexafluoride), and ($^t$BuN)$_2$W(NMe$_2$)$_2$ (bis(tert-butylimido)bis(dimethylamido)tungsten, BTBMW).

In some examples, a nitrogen-containing gas such as ammonia (NH$_3$) or hydrazine (N$_2$H$_4$) may be utilized as a source of nitrogen when depositing the barrier film 102. Examples of silicon-containing gases that may be utilized as sources of silicon include, but are not limited to, silane (SiH$_4$), disilane (Si$_2$H$_6$), monochlorosilane (SiClH$_3$), dichlorosilane (SiH$_2$Cl$_2$), trichlorosilane (SiHCl$_3$), hexachlorodisilane (Si$_2$Cl$_6$), diethylsilane (Et$_2$SiH$_2$), and alkylaminosilane compounds. Examples of alkylaminosilane compounds include, but are not limited to, di-isopropylaminosilane (H$_3$Si(NPr$_2$)), bis(tert-butylamino)silane ((C$_4$H$_9$(H)N)$_2$SiH$_2$), tetrakis(dimethylamino)silane (Si(NMe$_2$)$_4$), tetrakis(ethylmethylamino)silane (Si(NEtMe)$_4$), tetrakis(diethylamino)silane (Si(NEt$_2$)$_4$), tris(dimethylamino)silane (HSi(NMe$_2$)$_3$), tris(ethylmethylamino)silane (HSi(NEtMe)$_3$), tris(diethylamino)silane (HSi(NEt$_2$)$_3$), and tris(dimethylhydrazino)silane (HSi(N(H)NMe$_2$)$_3$), bis(diethylamino)silane (H$_2$Si(NEt$_2$)$_2$), bis(di-isopropylamino)silane (H$_2$Si(NPr$_2$)$_2$), tris(isopropylamino)silane (HSi(NPr$_2$)$_3$), and (di-isopropylamino)silane (H$_3$Si(NPr$_2$). In embodiments of the invention, the following abbreviations are used: Me: methyl; Et: ethyl; Pr: propyl; $^i$Pr: isopropyl; $^t$Bu: tert-butyl; Cp: cyclopentadienyl; and THD: 2,2,6,6-tetramethyl-3,5-heptanedionate.

FIG. 1A further shows a metal-containing wetting film 104 deposited on the barrier film 102 according to embodiments of the invention. The metal-containing wetting film 104 can contain a transition metal that provides a low contact angle for copper metal deposited onto the metal-containing wetting film 104. The metal-containing wetting film 104 can, for example, contain amorphous, polycrystalline, or crystalline ruthenium metal (Ru), palladium metal (Pd), rhodium metal (Rh), or silver metal (Ag), or a combination thereof. In other examples, the metal-containing wetting film can contain compounds of these metals and nitrogen (e.g., RuN), oxygen (e.g., RuO$_2$), carbon (e.g., RuC), boron (e.g., RuB), or phosphorus (e.g., RuP), for example. A thickness of the metal-containing wetting film 104 can, for example, be between about 0.1 nm and about 5 nm, or between about 0.5 nm and about 2 nm, for example about 1 nm. The metal-containing wetting film 104 may be deposited by a variety of different deposition methods known by one of ordinary skill in the art, including, but not limited to, CVD, pulsed CVD, PECVD, ALD, PEALD, or sputtering methods.

In one example, the metal-containing wetting film 104 may be a ruthenium metal wetting film 104 deposited on a tantalum nitride barrier film 102 by a CVD process at a substrate temperature of about 180° C. utilizing a Ru$_3$(CO)$_{12}$ precursor and a CO carrier gas. The ruthenium metal wetting film 104 can be deposited with very high continuity and thickness uniformity over high-aspect ratio structures and may be annealed to higher temperatures following deposition. An exemplary ruthenium metal CVD process using a Ru$_3$(CO)$_{12}$ precursor and a CO carrier gas is described U.S. Pat. No. 7,270,848, the entire content of which is herein incorporated by reference. In another example, the ruthenium metal film 104 may be deposited by a CVD process utilizing a ruthenium metalorganic precursor. Exemplary ruthenium metalorganic precursors include (2,4-dimethylpentadienyl) (ethylcyclopentadienyl)ruthenium (Ru(DMPD)(EtCp)), bis(2,4-dimethylpentadienyl)ruthenium (Ru(DMPD)$_2$), 4-dimethylpentadienyl)(methylcyclopentadienyl)ruthenium (Ru(DMPD)(MeCp)), and bis(ethylcyclopentadienyl)ruthenium (Ru(EtCp)$_2$), as well as combinations of these and other precursors. Other examples for depositing the ruthenium metal film 104 include sputtering methods using a solid ruthenium metal target.

In one example, the metal-containing wetting film can contain a compound of a wetting metal (Ru, Pd, Rh, Ag). For example, compounds containing ruthenium can include ruthenium and nitrogen, ruthenium and oxygen, ruthenium and carbon, ruthenium and boron, or ruthenium and phosphorus. These compounds may be formed by adding an additional gas containing nitrogen (e.g., NH$_3$), oxygen (e.g., H$_2$O), carbon (e.g., CH$_4$), boron (e.g., BH$_3$), or phosphorus (e.g., PH$_3$) to a process gas containing ruthenium during a CVD process.

FIG. 1B shows a recessed feature 2 containing a smooth copper metal seed layer 106 deposited on metal-containing wetting film 104 according to an embodiment of the invention. The copper metal seed layer 106 coats the metal-containing wetting film 104 at least substantially without gaps on the field region 106a, the sidewall region 106b, and the bottom region 106c. According to one embodiment of the invention, the smooth copper metal seed layer 106 may continuously coat the metal-containing wetting film.

A thickness of the copper metal seed layer 106 can, for example, be between about 0.1 nm and about 5 nm, or between about 0.5 nm and about 2 nm, for example about 1 nm As depicted in FIG. 1B, a thickness of the copper metal seed layer 106 may be greater on the field region 106a than on the sidewall region 106b or on the bottom region 106c.

Figure 5:
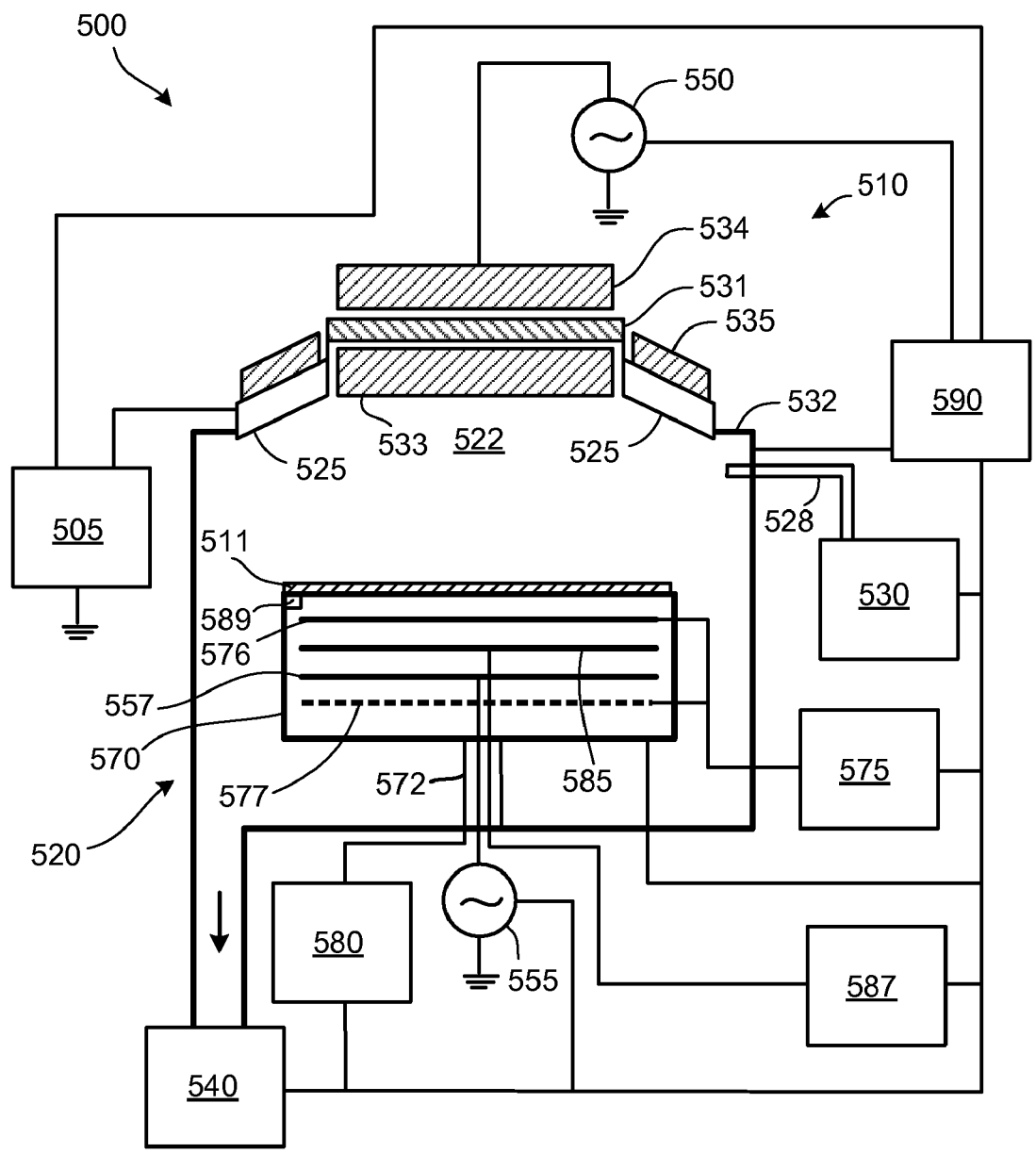
FIG. 5 illustrates an exemplary block diagram of a processing system for depositing a smooth copper seed layer according to an embodiment of the invention.

According to embodiments of the invention, the smooth copper metal seed layer 106 may be deposited onto the metal-containing wetting film 104 by sputtering methods, for example by physical vapor deposition (PVD) or ionized PVD (IPVD). Exemplary IPVD systems are illustrated in FIG. 5. and U.S. Pat. No. 6,287,435. During the copper metal deposition, the substrate is maintained at a substrate temperature that is sufficiently high to form the smooth copper metal seed layer 106 on the metal-containing wetting film 104. According to one embodiment of the invention, the substrate temperature can be greater than 0° C., for example approximately 20° C., approximately 30° C., or even higher. For example, the substrate temperature can range from greater than 0° C. to 200° C., from 10° C. to 100° C., from 20° C. to 50° C., or from 25° C. to 40° C.

Figure 2A:
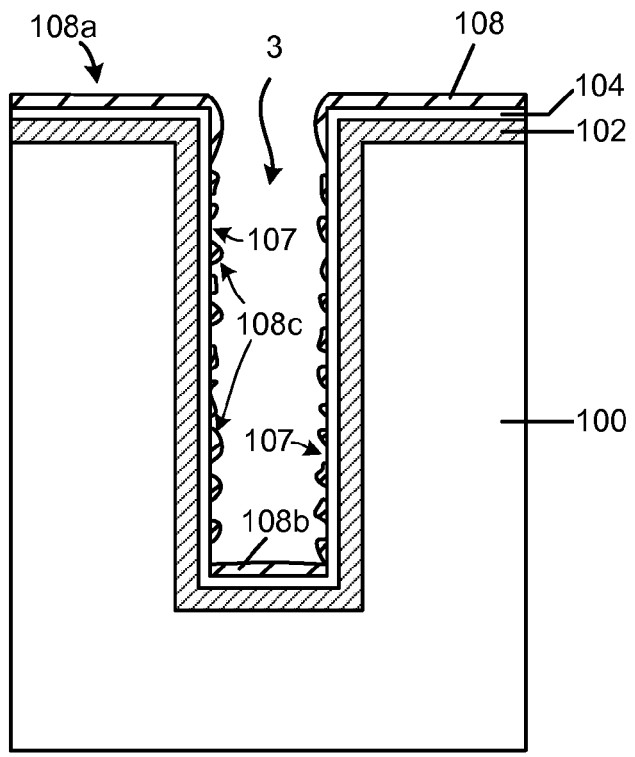
FIGS. 2A-2B schematically show cross-sectional views of a typical method for filling a recessed feature with bulk copper metal containing voids.

For comparison to FIG. 1B, FIG. 2A shows a recessed feature 3 containing a non-continuous copper metal seed layer deposited by PVD or IPVD onto metal-containing wetting film 104 at a substrate temperature of –30° C. The copper metal seed layer 108 contains copper metal seed layer portion 108a on the field area around the recessed feature 3, copper metal seed layer portion 108b in the bottom region of the recessed feature 3, and copper metal seed layer portion 108c on the sidewall region of the recessed feature 3. The copper metal seed layer portion 108c contains gaps 107 where the metal-containing wetting film 104 is not continuously covered with copper metal.

Referring back to FIGS. 1A-1C, FIG. 1C schematically shows void-free bulk copper metal overfilling of the recessed feature 2 in FIG. 1B. The formation of the void-free bulk copper metal over-fill 110 is enabled by copper plating on the smooth copper metal seed layer 106. Bulk copper metal deposition processes are well known by one of ordinary skill in the art of circuit fabrication and can, for example, include an electrochemical plating process or an electroless plating process. Although not shown in FIG. 1C, formation of the bulk copper metal overfill 110 is typically followed by a chemical mechanical polishing (CMP) process to planarize and remove excess copper metal, and the metal-containing wetting film 104 and the barrier film 102 from the field region 106a.

Figure 2B:
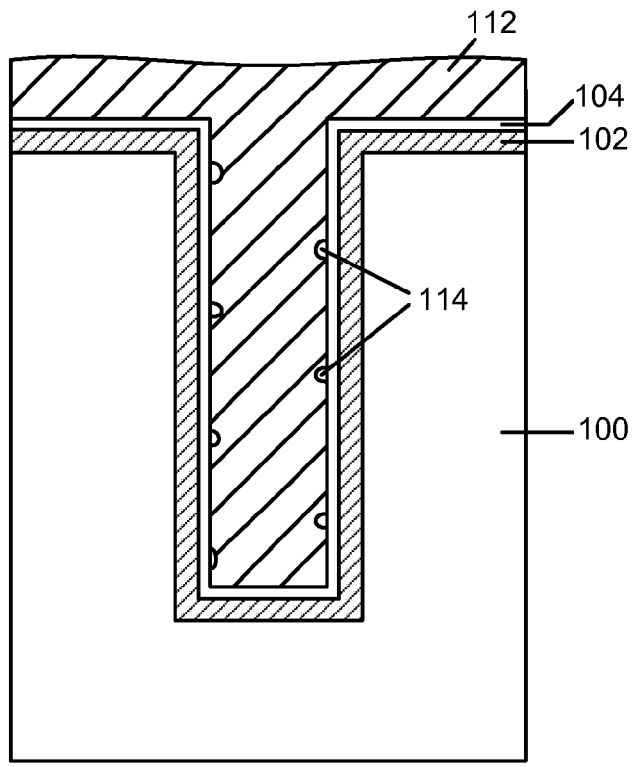

For comparison, FIG. 2B shows a bulk copper metal filling of the recessed feature 3 in FIG. 2A. As depicted in FIG. 2B, the bulk copper metal overfill 112 contains detrimental voids 114 near the interface of the bulk copper metal overfill 112 and the metal-containing wetting film 104. As is well known by one of ordinary skill in the art, the presence of the voids 114 in the bulk copper metal overfill 112 increases the electrical resistance and has other detrimental effects on a semiconductor device containing the bulk copper metal overfill 112.

FIGS. 3A-3D are process flow diagrams of methods for void-free filling of a recessed feature with bulk copper metal using a smooth copper metal seed layer according to embodiments of the invention. The process flows may be applied to a substrate having a topography including a top surface and at least one recessed feature comprising at least a sidewall surface and a bottom surface. In one example, the at least one recessed feature can contain a via, a trench, or a combination thereof such as a Dual Damascene structure.

Figure 3A:
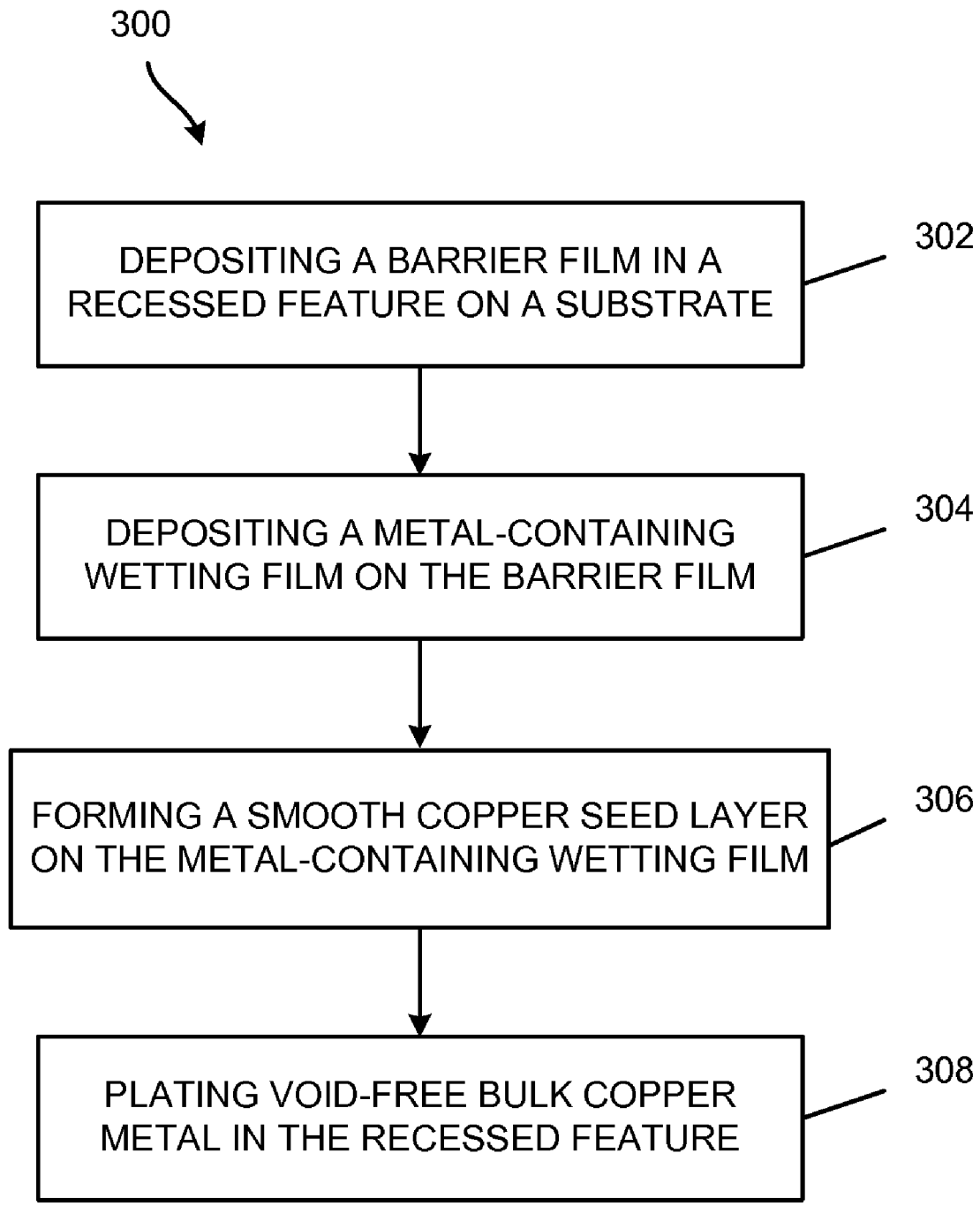
FIGS. 3A-3D are process flow diagrams of methods for void-free filling of a recessed feature with bulk copper metal using a smooth copper metal seed layer according to embodiments of the invention.

In FIG. 3A, the process 300 includes: in block 302, depositing a barrier film in a recessed feature on the substrate. The barrier film can contain tantalum nitride, titanium nitride, tungsten nitride, tantalum silicon nitride, titanium silicon nitride, or tungsten silicon nitride, or a combination thereof. According to one embodiment, the barrier film may be conformally deposited on the substrate topography with a substantially uniform film thickness. However, a substantially uniform thickness is not required as long as the barrier film continuously covers the substrate topography.

In block 304, a metal-containing wetting film is deposited on the barrier film. The metal-containing wetting film can, for example, contain amorphous, polycrystalline, or crystalline ruthenium metal (Ru), palladium metal (Pd), rhodium metal (Rh), or silver metal (Ag), or a combination thereof. In other examples, the metal-containing wetting film can contain compounds of these metals and nitrogen, oxygen, carbon, boron, or phosphorus. According to one embodiment, the metal-containing wetting film may be conformally deposited on the barrier film topography with a substantially uniform film thickness. However, a substantially uniform thickness is not required as long as the metal-containing wetting film continuously covers the substrate topography. According to one embodiment of the invention, both the barrier film and the metal-containing wetting film are both at least substantially conformally deposited over the substrate topography.

In one example, the barrier film contains tantalum nitride and the metal-containing wetting film contains ruthenium metal. The tantalum nitride can, for example, be deposited by CVD using a Ta-containing precursor and $NH_3$. In recessed features having a width of about 500 nm or less, a thickness of the tantalum nitride can, for example, be between about 1 nm and about 10 nm, or between about 2 nm and about 5 nm, for example about 4 nm. The ruthenium metal can, for example, be deposited by CVD using a $Ru_3(CO)_{12}$ precursor, a CO carrier gas, and a substrate temperature between 150° C. and 200° C., for example about 180° C. A thickness of the ruthenium metal film can, for example, be between about 0.1 nm and about 5 nm, or between about 0.5 nm and about 2 nm, for example about 1 nm.

In block 306, a smooth copper metal seed layer is formed on the metal-containing wetting film. The copper metal is deposited on the metal-containing wetting film using a physical vapor deposition process. According to embodiments of the invention, during the copper metal deposition, the substrate temperature is maintained sufficiently high (e.g., greater than 0° C.) to form a smooth copper metal seed layer on the metal-containing wetting film. According to embodiments of the invention, the substrate temperature is below a temperature at which substantial agglomeration of the copper metal in the copper metal seed layer occurs. According to one embodiment of the invention, the substrate temperature is greater than 0° C. and below a temperature at which substantial agglomeration of the copper metal in the copper metal seed layer occurs on the metal-containing wetting film.

In block 308, void-free bulk copper metal is plated in the recessed feature. The amount of bulk copper metal plated in the recessed feature may be sufficient to fill or overfill the recessed feature with bulk copper metal but this is not required as only partial filling of the recessed feature may be performed.

Figure 3B:
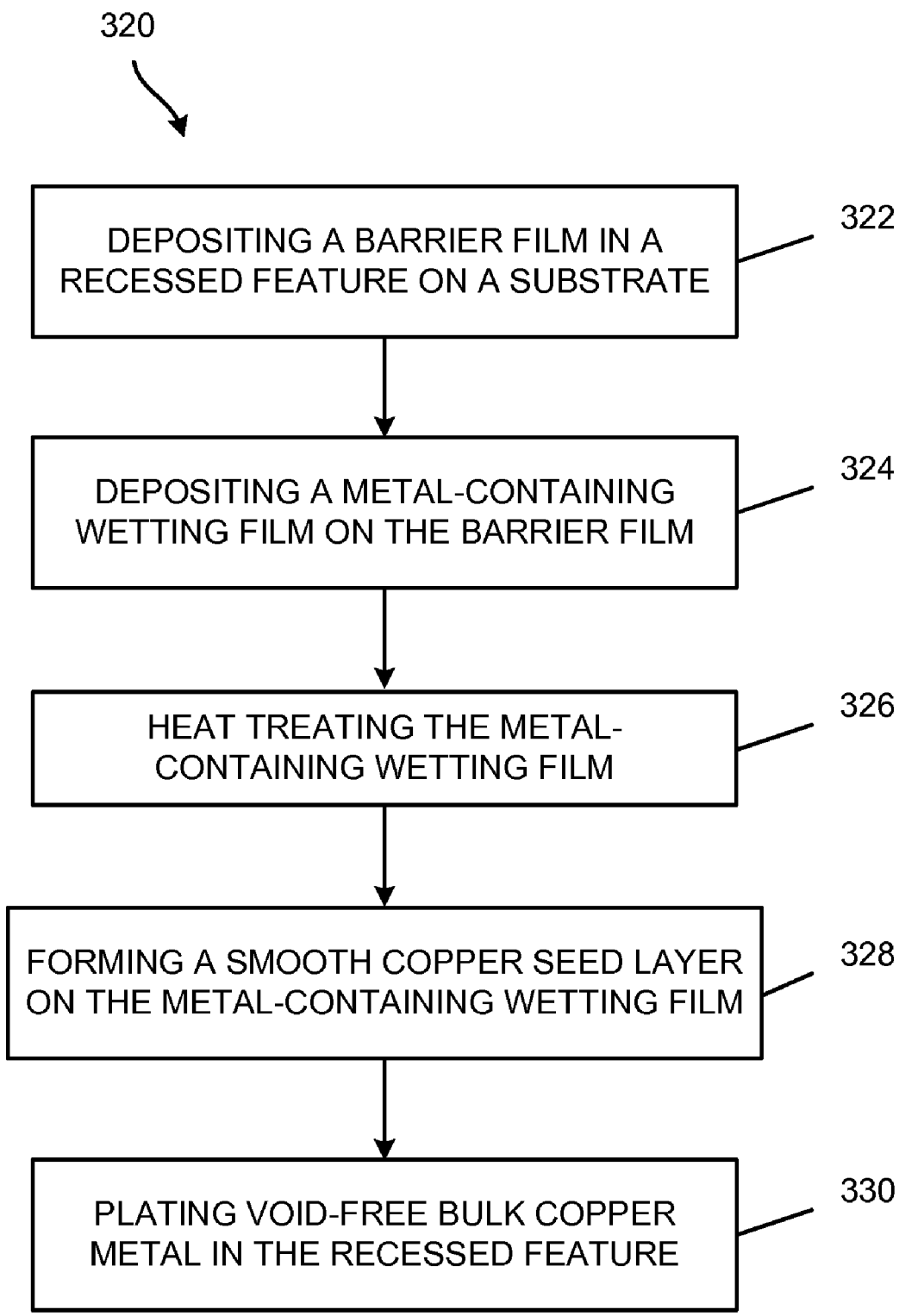

FIG. 3B is a process flow diagram of a method for void-free filling of a recessed feature with bulk copper metal using a smooth copper metal seed layer according to another embodiment of the invention. The process flow 320 is similar to the process flow 300 shown in FIG. 3A but includes: in block 322, depositing a barrier film in a recessed feature on the substrate; and in block 324, depositing a metal-containing wetting film on the barrier film.

In block 326, the metal-containing wetting film is heat-treated. According to embodiments of the invention, heat treating of the metal-containing wetting film, may include exposing, at elevated substrate temperature, the metal-containing wetting to an inert gas, $H_2$, or a combination of an inert gas and $H_2$. For example, the combination can include 0.1-100% $H_2$ and balance inert gas. The inert gas can, for example, be selected from a noble gas (i.e., He, Ne, Ar, Kr, Xe) and $N_2$. According to embodiments of the invention, the heat treating of the metal-containing wetting film may include heating the substrate to a substrate temperature between about 100° C. and about 400° C., between about 100° C. and about 300° C., or between about 100° C. and about 200° C., for example 150° C. It is contemplated that the heat treating of the metal-containing wetting film further increases wettability of copper metal on the metal-containing wetting film by chemically reducing or removing any oxidized portions of the metal-containing wetting film. The metal-containing wetting film may become oxidized during deposition of the metal-containing wetting film or by exposure to oxidizing gases such as water or carbon monoxide following the deposition.

One exemplary heat treatment of the metal-containing wetting film includes exposure to a process gas containing 5% $H_2$, balance $N_2$, a gas pressure of 3 Torr, substrate temperature of about 150° C., and process time of 1-30 minutes, but embodiments of the invention are not limited by these processing conditions as other heat treating conditions may be utilized. For example, the gas pressure can be between about 1 Torr and about 760 Torr. In some embodiments of the invention, the gas pressure can be between about 1 Torr and about 10 Torr. It should be noted that in this application, the term "block" does not prohibit two steps from being performed simultaneously or partially overlapping in time. For example, metal-containing wetting film deposition and heat treating of the metal-containing wetting film may be performed simultaneously or partially overlap in time.

In block 328, a smooth copper metal seed layer is formed on the metal-containing wetting film and, in block 330, void-free bulk copper metal is plated in the recessed feature.

Figure 3C:
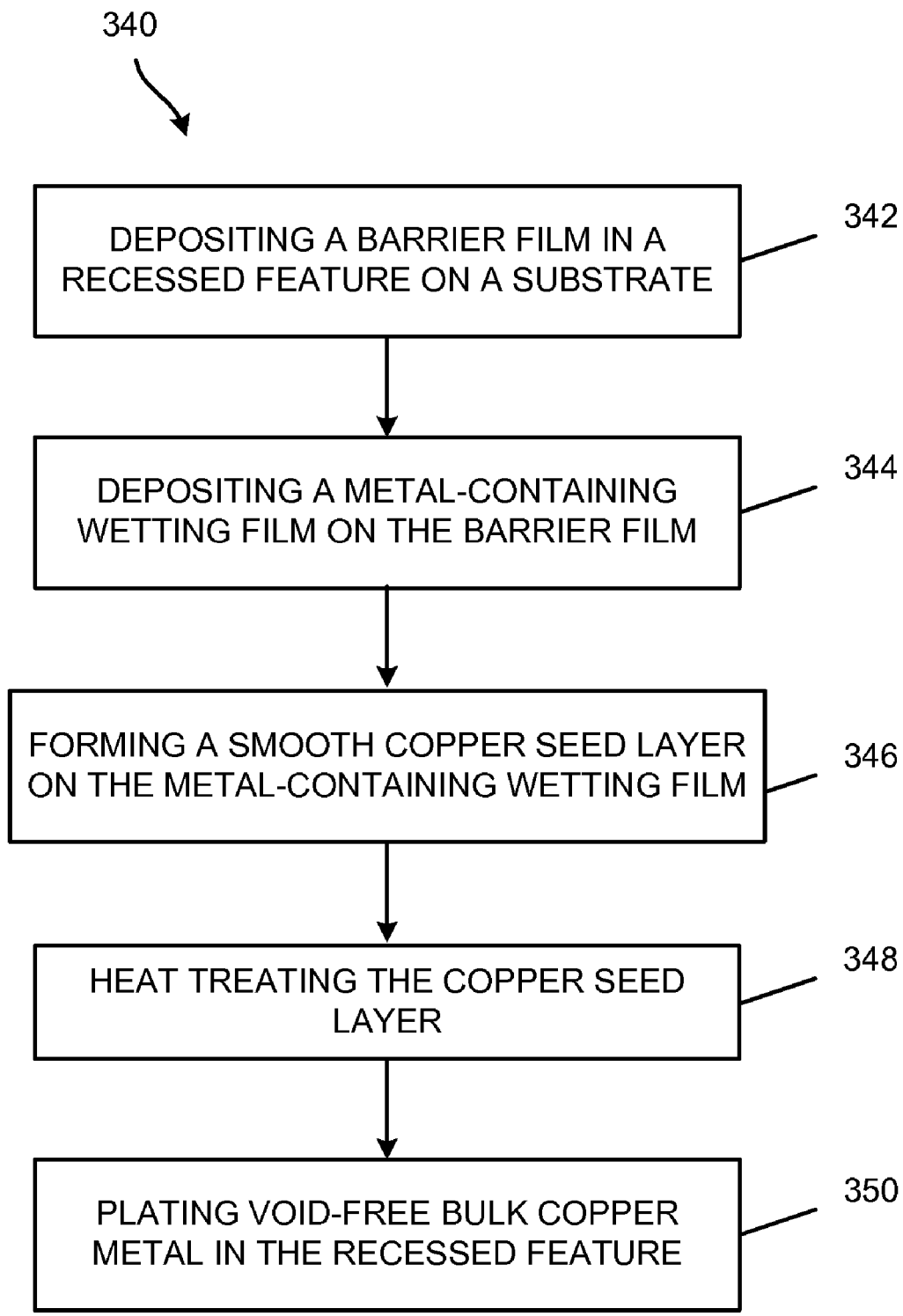

FIG. 3C is a process flow diagram of a method for void-free filling of a recessed feature with bulk copper metal using a smooth copper metal seed layer according to yet another embodiment of the invention. The process flow 340 is similar to the process flow 300 shown in FIG. 3A but includes: in block 342, depositing a barrier film in a recessed feature on the substrate; in block 344, depositing a metal-containing wetting film on the barrier film.

In block 346, a smooth copper metal seed layer is formed on the metal-containing wetting film.

In block 348, the copper metal seed layer is heat-treated. According to embodiments of the invention, heat treating of the copper metal seed layer may include exposing, at elevated substrate temperature, the copper metal seed layer to an inert gas, $H_2$, or a combination of an inert gas and $H_2$. For example, the combination can include 0.1-100% $H_2$ and balance inert gas. The inert gas can, for example, be selected from a noble gas (i.e., He, Ne, Ar, Kr, Xe) and $N_2$. According to embodiments of the invention, the heat treating of the copper metal seed layer may further include heating the substrate to a substrate temperature between about 100° C. and about 400° C., between about 100° C. and about 300° C., or between about 100° C. and about 200° C., for example 150° C. It is contemplated that the heat treating may chemically reduce or remove oxidized portions of the copper metal seed layer. The metal-containing wetting film may become oxidized during and/or following deposition of the copper metal seed layer.

One exemplary heat treatment of the copper metal seed layer includes exposure to a process gas containing 5% $H_2$, balance $N_2$, a gas pressure of 3 Torr, substrate temperature of about 150° C., and process time of 1-30 minutes, but embodiments of the invention are not limited by these processing conditions as other heat treating conditions may be utilized. For example, the gas pressure can be between about 1 Torr and about 760 Torr. In some embodiments of the invention, the gas pressure can be between about 1 Torr and about 10 Torr. For example, copper metal seed layer deposition and heat treating of the copper metal seed layer may be performed simultaneously or partially overlap in time.

In block 350, void-free bulk copper metal is plated in the recessed feature.

Figure 3D:
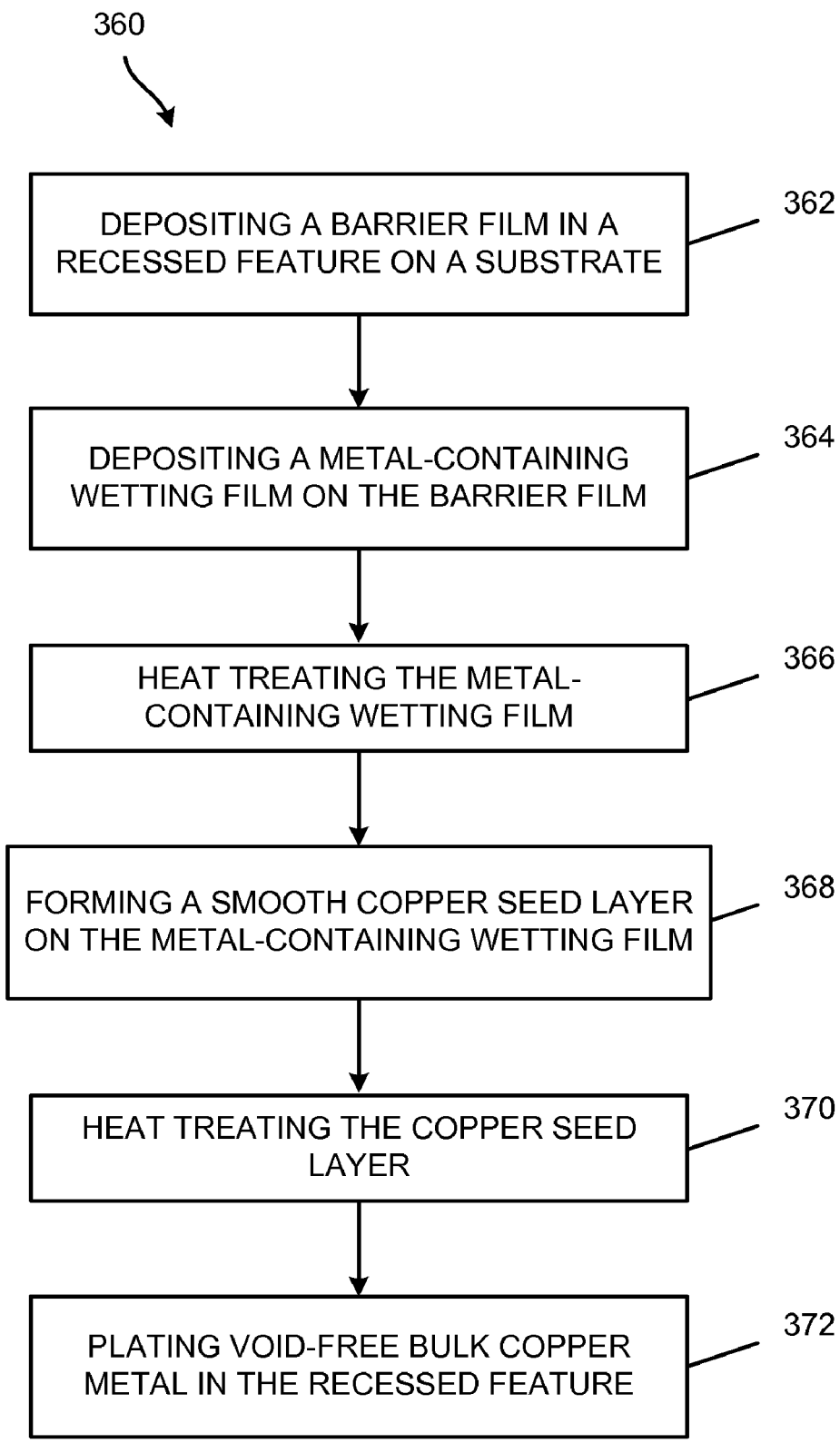

FIG. 3D is a process flow diagram of a method for void-free filling of a recessed feature with bulk copper metal using a smooth copper metal seed layer according to still another embodiment of the invention. The process flow 360 is similar to the process flows 300, 320, 340 shown in FIGS. 3A, 3B, 3C, respectively, but includes: in block 362, depositing a barrier film in a recessed feature on the substrate; and in block 364, depositing a metal-containing wetting film on the barrier film.

In block 366, the metal-containing wetting film is heat-treated. The heat treating of the metal-containing wetting film may be performed at a substrate temperature between about 100° C. and about 400° C. in the presence of an inert gas, $H_2$ gas, or a combination of $H_2$ gas and an inert gas.

In block 368, a smooth copper metal seed layer is formed on the metal-containing wetting film.

In block 370, the copper metal seed layer is heat-treated. The heat treating of the copper metal seed layer may be performed at a substrate temperature between about 100° C. and about 400° C. in the presence of an inert gas, $H_2$ gas, or a combination of $H_2$ gas and an inert gas. According to one embodiment of the invention, the heat treating in blocks 366 and 370 may utilize the same processing conditions.

In block 372, void-free bulk copper metal is plated in the recessed feature.

Figure 4A:
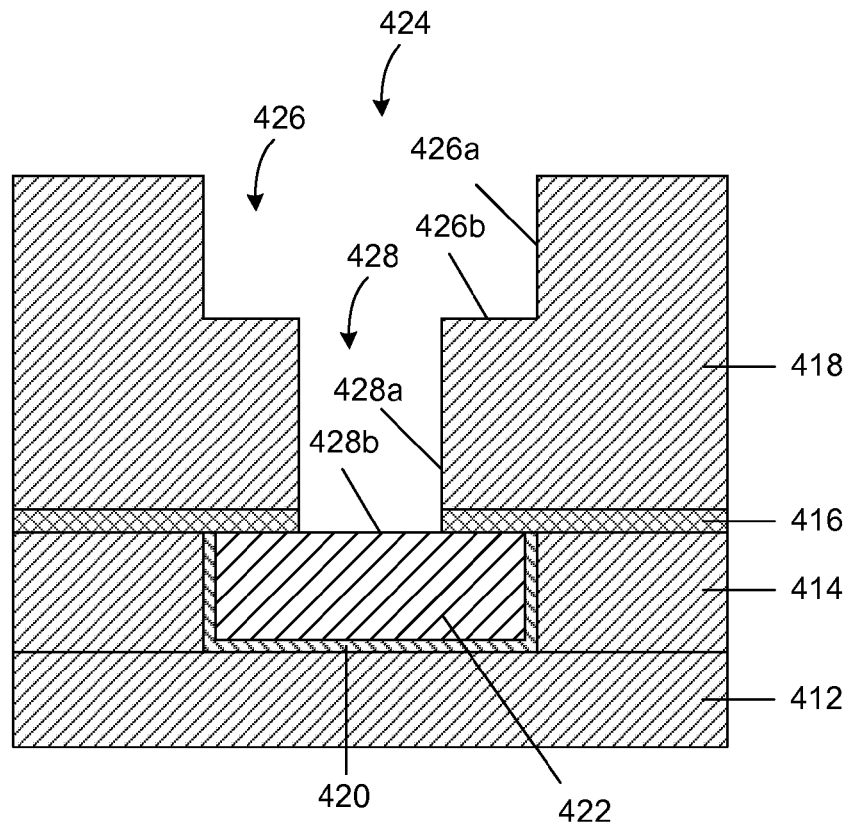
FIGS. 4A and 4B schematically show cross-sectional views of additional recessed features that may be filled with void-free bulk copper metal using a smooth copper metal seed layer according to embodiments of the invention.
Figure 4B:
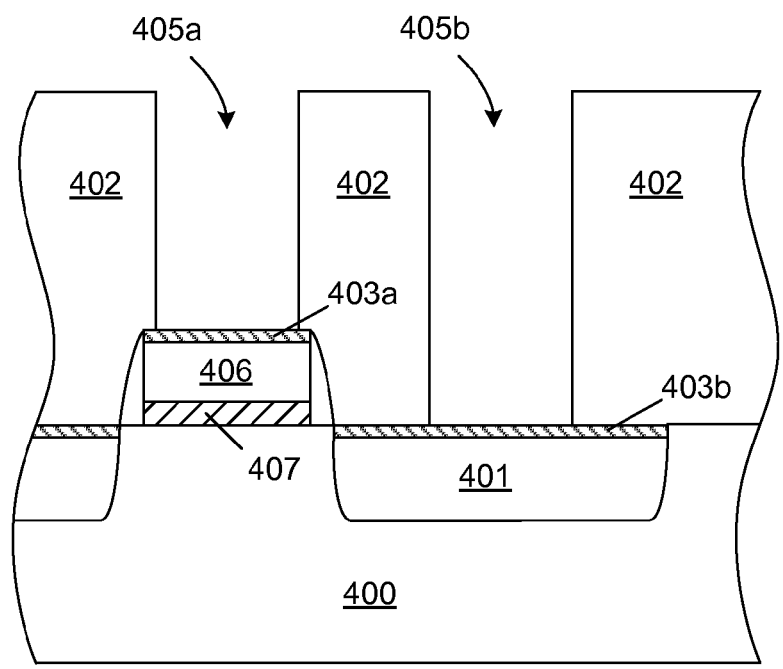

FIGS. 4A and 4B schematically show cross-sectional views of additional recessed features that may be filled with void-free bulk copper metal using a smooth copper metal seed layer according to embodiments of the invention. An exemplary recessed feature 1 was illustrated and described above in FIG. 1A, but embodiments of the invention may be applied to other types of recessed features found in integrated circuit design. As will be appreciated by one of ordinary skill in the art, embodiments of the invention that include barrier film deposition, metal-containing wetting film deposition, copper metal seed layer deposition, and void-free bulk copper metal filling can be readily applied to the recessed features depicted in FIGS. 4A and 4B.

FIG. 4A schematically shows a cross-sectional view of a patterned structure according to one embodiment of the invention. The patterned structure depicted contains a Dual Damascene feature 424 formed over conductive layer 422. The Dual Damascene feature 424 contains a via 428 having sidewall and bottom surfaces 428a and 428b, respectively, and a trench 426 formed in dielectric material 418, where the trench 426 contains sidewall and bottom surfaces 426a and 426b, respectively. The trench 426 may be used for an upper conductive interconnect structure and the via 428 connects the trench 426 to the conductive layer 422. The patterned structure further contains dielectric layers 412 and 414, barrier layer 420 surrounding the conductive layer 422, and etch stop layer 416.

FIG. 4B schematically shows a cross-sectional view of a patterned structure according to another embodiment of the invention. The patterned structure is formed on a substrate 400 and contains a recessed feature 405a formed in a dielectric film 402 and a conductive layer 403a formed on a gate electrode 406 at the bottom of the recessed feature 405a. The gate electrode 406 is part of a gate structure that further contains a gate dielectric film 407. The gate dielectric film 407 can contain $SiO_2$, $SiO_xN_y$, $SiN_y$, or a high dielectric constant (high-k) material having a dielectric constant greater than that of $SiO_2$ (k~3.9), or a combination thereof. High-k materials can include metal oxides, metal oxynitrides, and their silicates, for example $Ta_2O_5$, $TiO_2$, $ZrO_2$, $Al_2O_3$, $Y_2O_3$, $HfO_xN_y$, $HfSiO_xN_y$, $HfSiO_x$, $HfO_2$, $ZrSiO_x$, $ZrO_xN_y$, $ZrSiO_xN_y$, $TaSiO_x$, $SrO_x$, $SrSiO_x$, $LaO_x$, $LaSiO_x$, $YO_x$, $YSiO_x$, or BaO, or combinations of two or more thereof.

Furthermore, the patterned structure in FIG. 4B contains a recessed feature 405b formed in the dielectric film 402 and a conductive layer 403b formed on a doped substrate region 401 (e.g., a drain or a source region) in the substrate 400 at the bottom of the recessed feature 405b. The substrate 400 can, for example, be a 200 mm Si wafer, a 300 mm Si wafer, or an even larger Si wafer. The dielectric film 402 can contain $SiO_2$, SiON, SiN, or a low dielectric constant (low-k) material having a dielectric constant less than that of $SiO_2$ (k~3.9). According to an embodiment of the invention, the recessed features 405a, 405b can be vias with aspect ratios (depth/width) greater than or equal to about 2, for example 3, 4, 5, 6, 7, 12, 15, or higher. The vias can have widths of about 200 nm or less, for example 150 nm, 100 nm, 65 nm, 45 nm, 32 nm, 20 nm, or lower. In one example, the recessed features 405a, 405b can be 45 nm wide vias with aspect ratios of about 7. However, embodiments of the invention are not limited to these aspect ratios or via widths, as other aspect ratios or via widths may be utilized. The conductive layers 403a and 403b can include silicide contact layers that provide thin stable electrical contacts and can, for example, contain $CoSi_2$, PtSi, $Pd_2Si$, $TiSi_2$, $WSi_2$, $NiSi_2$, or $TaSi_2$, or a combination of two or more thereof. One combination may contain PtNiSi that allows the use of higher processing temperatures than $NiSi_2$. Processing methods for forming the patterned structures depicted in FIGS. 4A and 4B are well known to one skilled in the art.

FIG. 5 illustrates an exemplary block diagram of a processing system for depositing a smooth copper seed layer according to an embodiment of the invention. In the illustrated embodiment, an IPVD system 500 is shown. The IPVD system 500 includes an IPVD processing module 510, a direct current (DC) power source 505 coupled to a copper metal target 525 that is coupled to the process chamber 520, a process gas supply system 530, a pressure control system 540, a radio frequency (RF) generator 550, a RF bias generator 555 that can be coupled to an electrode 557 in temperature-controlled substrate holder 570, a substrate temperature control system 575 coupled to the temperature-controlled substrate holder 570, a backside gas supply system 580 that can be coupled to the temperature-controlled substrate holder 570, and an electrostatic chuck (ESC) electrode 585 connected to an ESC control unit 587.

The IPVD system 500 contains a controller 590 coupled to the process chamber 520, the DC power source 505, the process gas supply system 530, the pressure control system 540, the RF generator 550, the RF bias generator 555, the substrate holder 570, substrate holder temperature control system 575, the backside gas supply system 580, and the ESC control unit 587.

The IPVD processing module 510 contains an antenna 534, a RF transmissive window 531 coupled to the antenna 534, a louvered deposition baffle 533 coupled to the window 531, and the copper metal target 525 coupled to the process chamber 520. RF power can be supplied to the antenna 534 from the RF generator 550, and the RF power transmitted through the window 531 creates an inductively coupled plasma (ICP) in a plasma region 522 of the process chamber 520. According to embodiments of the invention, the inductively coupled plasma can be mainly confined to the plasma region 522 near the copper metal target 525, the window 531, and the baffle 533.

The antenna 534 can be electrically connected to the RF generator 550 using a RF matching network (not shown). The RF generator 550 can be used to selectively energize or power the antenna 534. The RF generator 550 can provide a time-varying RF current at a frequency between about 100 kHz and about 100 MHz that is supplied to the antenna 534 at an ICP power ranging between about 100 watts and about 10,000 watts. For example, an operating frequency of approximately 13.56 MHz can be used. Alternately, other frequencies can be used. When energized by the RF generator 550, the antenna 534 radiates isotropic RF electromagnetic fields. A metallic outer enclosure or cage (not shown) can be used to surround the antenna to confine the radiated RF electromagnetic fields therein to ensure the safety of nearby persons and to prevent electromagnetic interference with surrounding electronics.

The antenna 534 can be positioned outside of the process chamber 520 behind the window 531 in the chamber wall 532. The louvered deposition baffle 533, preferably formed of a slotted metallic material, is located inside of the process chamber 520 closely spaced from the window 531 to shield the window 531 from deposition. The controller 590 can be used to determine the amount of ICP power to provide and when to have it applied to the antenna 534.

The IPVD system 500 contains temperature-controlled substrate holder 570 that includes an ESC electrode 585 and can be coupled to the process chamber 520 using a Z-motion drive 572. The Z-motion drive 572 can be used to adjust the substrate-to-target distance (gap) to provide the best deposition uniformity. The controller 590 can be used to determine the substrate-to-target distance required during the copper metal deposition process and provide the control data to the Z-motion drive 572 when it is required. During a copper metal deposition process, the substrate-to-target distance can typically be 550 to 300 mm.

The substrate holder 570 can accommodate a 200 mm substrate, a 300 mm substrate, or a larger substrate. For example, a substrate 511 can be transferred into and out of process chamber 520 through an opening (not shown) that is controlled by a gate valve assembly (not shown). In addition, the substrate 511 can be transferred on and off the substrate holder 570 using a robotic substrate transfer system (not shown). In addition, the substrate 511 can be received by substrate lift pins (not shown) housed within substrate holder 570 and mechanically translated by devices housed therein. Once the substrate 511 is received from the transfer system, it can be lowered to an upper surface of the substrate holder 570 for processing.

During processing, the substrate 511 can be held in place on top of the substrate holder 570 using ESC electrode 585. Alternately, other clamping means may be used.

In addition, the substrate temperature can be controlled when the substrate is on the temperature-controlled substrate holder 570. The temperature-controlled substrate holder 570 can include a heater assembly 576 and a cooling assembly 577 that can be coupled to the temperature control system 575. The heater assembly 576 and the cooling assembly 577 can be used along with one or more backside gases to establish the desired substrate temperature. The controller 590 can be used to determine and control the substrate temperature. For example, the cooling assembly 577 may include fluid passages (not shown) in the substrate holder 570 and the appropriate temperature controls. For example, heat generated in the substrate 511 during plasma processing can be extracted efficiently by the substrate holder 570 to keep the substrate 511 at a substantially constant temperature, or the heat can be used to increase the substrate temperature. The substrate temperature may be controlled between about −50° C. and about 200° C. by varying the temperature of temperature-controlled substrate holder 570.

Gas channels (not shown) can be used to direct a backside (heat transfer) gas, such as helium gas or argon gas, between the top of the substrate holder 570 and the facing surface of the substrate 511. For example, a two-zone system may be used to establish different and independent backside pressure values for a center portion and an edge portion thereby providing a different thermal conductivity between the substrate holder 570 and different portions of the substrate 511.

One or more temperature sensors 589 can be positioned at one or more locations on or within the substrate holder 570 and can be coupled to the controller 590 that converts signals from the temperature sensors 589 to provide an indication of the temperature of different portions of the substrate holder 570. The temperature of the substrate holder 570 can be used to determine the temperature of the substrate 511 and the controller 590 can provide feedback information to the temperature control system 575 and the backside gas supply system 580 for regulating the temperature of substrate 511.

According to one embodiment of the invention, the substrate 511 and the substrate holder 570 may be grounded. According to another embodiment of the invention, RF bias power can be supplied to the electrode 557 in the substrate holder 570 using the RF bias generator 555, and can be used to provide a substrate bias. The controller 590 can be used to determine the amount of RF bias power to provide and when to have it applied to the substrate holder 570. For example, RF bias power can be turned on to a level appropriate during copper metal deposition processes to control the bias on the substrate 511 to improve and affect the process.

The operating frequency for the RF bias generator 555 can range from 1 MHz to 100 MHz. The RF bias generator 555 can be used to selectively apply a bias potential that accelerates positively charged plasma components toward the substrate 511. The bias potential provided by the RF bias generator 555 substantially determines the kinetic energies of positive ions attracted to the substrate from the plasma. The RF bias generator 555 can, for example, operate at a frequency of about 13.56 MHz and at a power between about 100 watts and about 1000 watts. Alternately, other frequencies can be used, such as 2 MHz or 27 MHz.

Process gas can be provided to the process chamber 520 by the process gas supply system 530. The process gas can contain an inert gas such as argon gas (Ar), or any other inert gas or non-inert gas that is compatible with the process. The argon gas may be introduced into the process chamber 520 by a gas line 528. Alternately, other configurations may be used for introducing the argon gas into the process chamber 520. As schematically illustrated in FIG. 5, argon gas may be introduced into the process chamber 520 proximate the copper metal target 525.

Chamber pressure can be controlled using the pressure control system 540. The pressure control system 540 can, for example, contain a vacuum pump (not shown) and a throttle valve (not shown). The chamber pressure can be maintained at a low pressure, for example below 100 mTorr, by the pressure control system 540. The controller 590 can be used to control the pressure control system 540, and/or the process gas supply system 530 and to control the chamber pressure accordingly.

DC power can be supplied from DC power source 505 to the copper metal target 525. The controller 590 can be used to determine the amount of DC power to provide and when to have it applied to the target. For example, the DC power can range from 1,000 watts to 10,000 watts, and can be about 2,000 watts.

The controller 590 can be configured to provide control data to the system components and receive process and/or status data from the system components. In addition, the controller 590 may be coupled to another control system (not shown), and can exchange information with the other control system. For example, the controller 590 can comprise a microprocessor, a memory (e.g., volatile or non-volatile memory), and a digital I/O port capable of generating control voltages sufficient to communicate and activate inputs to the IPVD system 500 as well as monitor outputs from the IPVD system 500. Moreover, the controller 590 can exchange information with the system components, and a program stored in the memory can be utilized to control the aforementioned components of the IPVD system 500 according to a process recipe. In addition, the controller 590 can be configured to analyze the process and/or status data, to compare the process and/or status data with desired process and/or status data, and to use the comparison to change a process and/or control a system component. In addition, the controller 590 can be configured to analyze the process and/or status data, to compare the process and/or status data with historical process and/or status data, and to use the comparison to predict, prevent, and/or declare a fault.

FIG. 5 further shows a magnet assembly 535 coupled to the process chamber 520. The magnet assembly 535 may be used to shape the plasma within the plasma region 522 in the process chamber 520. Examples of systems having minimized and controllable magnetic fields are described in U.S. Patent Application Publication No. 20040188239, and this patent application is incorporated herein by reference. As shown in FIG. 5, the magnet assembly 535 can be located behind the copper metal target 525 and can be used to produce and/or change a static magnetic field shape in within the plasma region 522 in the process chamber 520. In one embodiment, copper metal deposition process can be performed using a magnet assembly 535 having a weak magnetic field strength. Field lines from the magnets can extend into the process volume. In alternate embodiments, these or other field lines present in the chamber may be caused to change to enhance the copper metal deposition process. For example, magnetic fields may be changed by controlling the magnet configuration, by physically moving and/or rotating a magnet. In addition, an electromagnet or electromagnet component may be used to change a magnetic field. In addition, a local static magnetic field may be used to optimize the performance of the target. Some magnet pack configurations for IPVD may typically produce static magnetic field strength at the target surface of over 150 Gauss or several hundred Gauss, to provide confinement of the plasma and a desired erosion profile and high target utilization. Reducing the static magnetic field strength at target surface to about 5-10 Gauss eliminates this confinement effect. According to some embodiments of the invention, the magnet assembly 535 may be omitted from the IPVD system 500.

In various embodiments, one or more process parameters can be measured and compared with desired process parameters to control the operation of one or more components of the IPVD system 500. The measured performance can be used to alter one or more process parameters, such as a DC-on time, a shaping plasma process time, a DC-off time, a DC power, ICP power, backside gas pressure, substrate holder temperature, substrate temperature, process gas flow rate, process chamber pressure, and copper metal deposition rate.

It is to be understood that the IPVD system depicted in FIG. 5 is shown for exemplary purposes only, as many variations of the specific hardware can be used to implement plasma processing systems in which embodiments of the present invention may be practiced, and these variations will be readily apparent to one having ordinary skill in the art. Alternately, other types of plasma processing systems may be utilized for depositing the conformal copper metal seed layer. In one example, a capacitive coupled plasma (CCP) system where a copper metal target forms an upper electrode and a substrate holder upon which a substrate is positioned forms a lower electrode.

A method for controlling copper agglomeration on a substrate and for depositing smooth copper metal seed layers over recessed features and filling the recessed features with void-free bulk copper metal has been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a substrate is directly on and in immediate contact with the substrate; there may be a second film or other structure between the film and the substrate.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method for controlling copper agglomeration on a substrate, the method comprising:
providing a substrate having a topography including a top surface and at least one recessed feature comprising at least a sidewall surface and a bottom surface;
depositing a barrier film on the substrate topography;
depositing a metal-containing wetting film on the barrier film;
sputtering copper metal from a copper metal target; and
exposing the metal-containing wetting film to the sputtered copper metal at a substrate temperature between greater than 0° C. and 200° C., wherein the exposing deposits a continuous copper metal seed layer with no overhang on the metal-containing wetting film at an inlet of the recessed feature.

2. The method of claim 1, wherein the metal-containing wetting film comprises palladium metal (Pd), rhodium metal (Rh), or silver metal (Ag), or compounds of ruthenium metal (Ru), Pd, Rh, or Ag that further comprise nitrogen, oxygen, carbon, boron, or phosphorus.

3. The method of claim 1, further comprising:
heat treating the metal-containing wetting film at a temperature between about 100° C. and about 400° C. in the presence of an inert gas, $H_2$ gas, or a combination of $H_2$ gas and an inert gas.

4. The method of claim 1, further comprising:
heat treating the copper metal seed layer at a temperature between about 100° C. and about 400° C. in the presence of an inert gas, $H_2$ gas, or a combination of $H_2$ gas and an inert gas.

5. The method of claim 1, wherein the barrier film comprises tantalum nitride, titanium nitride, tungsten nitride, tantalum silicon nitride, titanium silicon nitride, or tungsten silicon nitride, or a combination thereof.

6. The method of claim 1, wherein the at least one recessed feature is formed in a dielectric material.

7. The method of claim 1, wherein the metal-containing wetting film comprises ruthenium metal (Ru).

8. The method of claim 1, wherein the substrate temperature is between 10° C. and 100° C.

9. A method for processing a substrate, the method comprising:
providing a substrate having a topography including a top surface and at least one recessed feature comprising at least a sidewall surface and a bottom surface;
depositing a barrier film on the substrate topography, the barrier film having a thickness between about 1nm and about 10nm in the at least one recessed feature;
depositing a metal-containing wetting film on the barrier film, the metal-containing wetting film comprising ruthenium metal (Ru), palladium metal (Pd), rhodium metal (Rh), silver metal (Ag), or compounds of Ru, Pd, Rh, or Ag that further comprise nitrogen, oxygen, carbon, boron, or phosphorus;
sputtering copper metal from a copper metal target;
exposing the metal-containing wetting film to the sputtered copper metal at a substrate temperature between greater than 0° C. and 200° C., wherein the exposing to the sputtered copper metal deposits a continuous copper metal seed layer with no overhang on the metal-containing wetting film at an inlet of the at least one recessed feature; and
plating void-free bulk copper metal in the at least one recessed feature.

10. The method of claim 9, wherein the plating fills or overfills the at least one recessed feature.

11. The method of claim 9, further comprising:
heat treating the metal-containing wetting film at a temperature between about 100° C. and about 400° C. in the presence of an inert gas, $H_2$ gas, or a combination of $H_2$ gas and an inert gas.

12. The method of claim 9, further comprising:
heat treating the copper metal seed layer at a temperature between about 100° C. and about 400° C. in the presence of an inert gas, $H_2$ gas, or a combination of $H_2$ gas and an inert gas.

13. The method of claim 9, wherein the barrier film comprises tantalum nitride, titanium nitride, tungsten nitride, tantalum silicon nitride, titanium silicon nitride, or tungsten silicon nitride, or a combination thereof.

14. A method for processing a substrate, the method comprising:
providing a substrate having a topography including a top surface and at least one recessed feature comprising at least a sidewall surface and a bottom surface, the least one recessed feature comprising a via, a trench, or a combination thereof;
depositing a barrier film on the substrate topography including in the at least one recessed feature, the barrier film having a thickness between about 1nm and about 10nm in the one or more recessed features;
depositing a ruthenium metal wetting film on the barrier film in a chemical vapor deposition process using $Ru_3(CO)_{12}$ precursor and CO carrier gas, the ruthenium metal film having a thickness between about 0.1 nm and about 5 nm in the one or more recessed features;
sputtering copper metal from a copper metal target;
exposing the metal-containing wetting film to the sputtered copper metal at a substrate temperature between greater than 0° C. and 200° C., wherein the exposing to the sputtered copper metal deposits a continuous copper metal seed layer with no overhang on the metal-containing wetting film in the at least one recessed feature; and
plating void-free bulk copper metal in the at least one recessed feature, wherein the plating fills or overfills the at least one recessed feature.

15. The method of claim 14, further comprising:
heat treating the metal wetting film at a temperature between about 100° C. and about 400° C. in the presence of an inert gas, $H_2$ gas, or a combination of $H_2$ gas and an inert gas.

16. The method of claim 14, further comprising:
heat treating the copper metal seed layer at a temperature between about 100° C. and about 400° C. in the presence of an inert gas, $H_2$ gas, or a combination of $H_2$ gas and an inert gas.

17. The method of claim 14, wherein the barrier film comprises tantalum nitride, titanium nitride, tungsten nitride, tantalum silicon nitride, titanium silicon nitride, or tungsten silicon nitride, or a combination thereof 18. The method of claim 14, wherein the recessed feature has a width of about 100 nm or less and an aspect ratio greater than 2:1.

19. The method of claim 14, wherein the substrate temperature is between 10° C. and 100° C.

* * * * *